United States Patent
Akagi et al.

(10) Patent No.: US 9,648,183 B2
(45) Date of Patent: May 9, 2017

(54) ELECTRIC DEVICE

(71) Applicant: BROTHER KOGYO KABUSHIKI KAISHA, Nagoya-shi, Aichi-ken (JP)

(72) Inventors: Koji Akagi, Inazawa (JP); Masaaki Wakizaka, Ichinomiya (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 12 days.

(21) Appl. No.: 14/798,639

(22) Filed: Jul. 14, 2015

(65) Prior Publication Data
US 2016/0021266 A1 Jan. 21, 2016

(30) Foreign Application Priority Data
Jul. 18, 2014 (JP) ................. 2014-148104

(51) Int. Cl.
G06F 3/044 (2006.01)
H04N 1/00 (2006.01)
G06K 15/00 (2006.01)
H03K 17/96 (2006.01)

(52) U.S. Cl.
CPC ....... *H04N 1/00493* (2013.01); *G06K 15/005* (2013.01); *H03K 17/9622* (2013.01); *H04N 1/00392* (2013.01); *H04N 1/00496* (2013.01); H03K 2217/960755 (2013.01); H04N 2201/0081 (2013.01); H04N 2201/0093 (2013.01)

(58) Field of Classification Search
CPC ............. H04N 1/41; H04N 2201/0039; H04N 2201/0081
See application file for complete search history.

(56) References Cited

U.S. PATENT DOCUMENTS

| 7,129,933 | B1 | 10/2006 | Nishikawa et al. |
| 2008/0100592 | A1 | 5/2008 | Shigeno et al. |
| 2008/0182639 | A1* | 7/2008 | Antonopoulos .......... G07F 9/02 463/17 |
| 2009/0033636 | A1 | 2/2009 | Toyota et al. |
| 2011/0193817 | A1* | 8/2011 | Byun .................... G06F 3/0418 345/174 |

(Continued)

FOREIGN PATENT DOCUMENTS

| JP | 2000-181629 A | 6/2000 |
| JP | 3792920 B2 | 7/2006 |
| JP | 2008-97283 A | 4/2008 |

(Continued)

*Primary Examiner* — Olga Merkoulova
(74) *Attorney, Agent, or Firm* — Merchant & Gould P.C.

(57) ABSTRACT

An electric device, including a chassis and an operation panel, is provided. The operation panel is disposed on a face of the chassis and has one end and the other end opposite from the one end. The operation panel includes a first capacitive touch switch configured to be responsive to a touch and a second capacitive touch switch configured to be responsive to a touch. The first capacitive touch switch has a first sensitivity for responding to the touch, and the second capacitive touch switch has a second sensitivity for responding to the touch. The second capacitive touch switch is arranged in a position closer to the one end of the operation panel than the first capacitive touch switch, and the second sensitivity of the second capacitive touch switch is lower than the first sensitivity of the first capacitive touch switch.

28 Claims, 9 Drawing Sheets

(56) References Cited

U.S. PATENT DOCUMENTS

2011/0242613 A1* 10/2011 Ishida ................ H04N 1/00352
                                                          358/442
2014/0092624 A1*  4/2014 Tsubakimoto ..... H04N 1/00204
                                                          362/602

FOREIGN PATENT DOCUMENTS

| JP | 2009-37373 A | 2/2009 |
| JP | 2010-86236 A | 4/2010 |
| JP | 5038453 B2 | 10/2012 |
| JP | 5065431 B2 | 10/2012 |
| WO | 2009/005026 A1 | 1/2009 |

* cited by examiner

ELECTRIC DEVICE

CROSS REFERENCE TO RELATED APPLICATION

This application claims priority from Japanese Patent Application No. 2014-148104 filed on Jul. 18, 2014, the entire subject matter of which is incorporated herein by reference.

BACKGROUND

Technical Field

An aspect of the present invention relates to an electric device equipped with an operation panel having capacitance touch-sensitive switches.

Related Art

An electric device with an operation panel having touch-sensitive switches is known. While multiple touch-sensitive switches may be arranged in a limited area in the operation panel, when an angle between the operation panel and a user's finger to touch one of the touch-sensitive switches in the operation panel is small, the user's finger may erroneously touch adjoining switches to actuate unintended switches.

SUMMARY

In order to avoid such erroneous actuation or input against the user's intention, permittivity in each of adjoining touch-sensitive switches may be varied.

The present invention is advantageous in that an electric device with an operation panel having touch-sensitive switches, by which a user's unintentional input may be restrained, is provided.

According to an aspect of the present invention, an electric device, including a chassis, and a first switch and a second switch, is provided. The chassis includes an operation panel to be manipulated by a user and is disposed on a face of the chassis. The operation panel includes a frontward end and a rearward end. The first switch and the second switch are arranged on the operation panel and are configured to be actuated by a change in capacitance. The second switch is arranged in a position closer to the frontward end of the operation panel than the first switch and is configured to be less sensitive than the first switch.

According to another aspect of the present invention, an electric device, including a chassis, and a first switch and a second switch, is provided. The chassis includes an operation panel to be manipulated by a user, and the operation panel is disposed on a face of the chassis. The operation panel includes an upper end and a lower end. The first switch and the second switch are arranged on the operation panel and are configured to be actuated by a change in capacitance. The second switch is arranged in a position closer to the lower end of the operation panel than the first switch and is configured to be less sensitive than the first switch.

According to still another aspect of the present invention, an electric device, including a chassis and an operation panel, is provided. The operation panel is disposed on a face of the chassis and has one end and the other end opposite from the one end. The operation panel includes a first capacitive touch switch configured to be responsive to a touch and a second capacitive touch switch configured to be responsive to a touch. The first capacitive touch switch has a first sensitivity for responding to the touch, and the second capacitive touch switch has a second sensitivity for responding to the touch. The second capacitive touch switch is arranged in a position closer to the one end of the operation panel than the first capacitive touch switch, and the second sensitivity of the second capacitive touch switch is lower than the first sensitivity of the first capacitive touch switch.

BRIEF DESCRIPTION OF THE ACCOMPANYING DRAWINGS

DETAILED DESCRIPTION

Hereinafter, embodiments according to aspects of the present invention will be described in detail with reference to the accompanying drawings. It is noted that various connections are set forth between elements in the following description, and these connections in general and, unless specified otherwise, may be direct or indirect and that this specification is not intended to be limiting in this respect.

Figure 1:
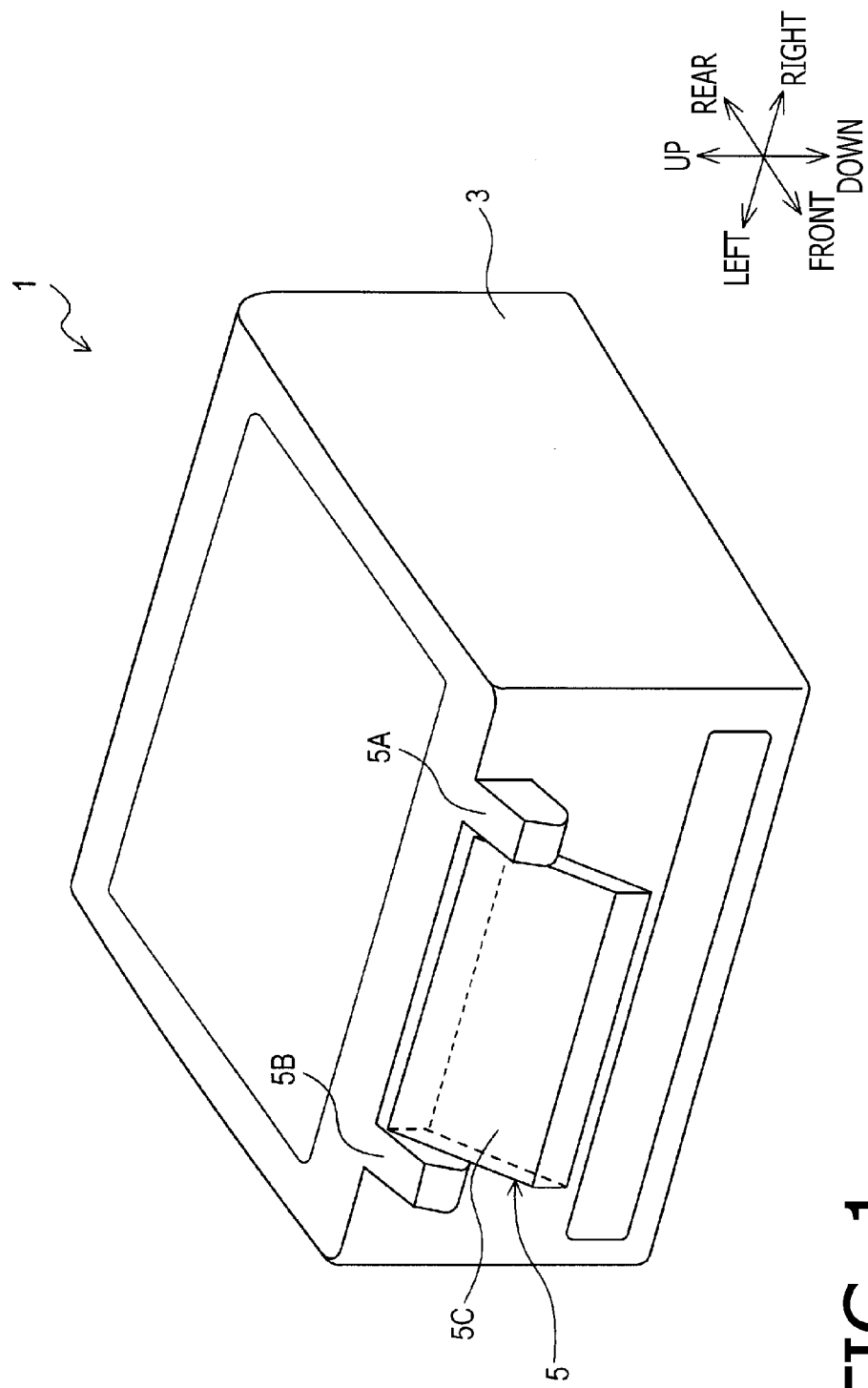
FIG. 1 is an illustrative external perspective view of an image forming apparatus according to a first embodiment of the present invention.

In the following description, an image forming apparatus 1 representing an electric device according to the present invention will be described. While the image forming apparatus 1 is described, directions concerning the image forming apparatus 1 will be referred to in accordance with a user's ordinary position to use the image forming apparatus 1, as indicated by the arrows in each drawing. For example, a viewer's lower-left side appearing in FIG. 1 is referred to as a front side of the image forming apparatus 1, and an upper-right side in FIG. 1 opposite from the front side is referred to as a rear side. A side which corresponds to the viewer's upper-left side is referred to as a left-hand side for the user, and an opposite side from the left, which corresponds to the viewer's lower-right side is referred to as a right-hand side for the user. An up-down direction in FIG. 1 corresponds to a vertical direction of the image forming apparatus 1. Further, the right-to-left or left-to-right direction of the image forming apparatus 1 may be referred to as a widthwise direction, and the front-to-rear or rear-to-front direction may be referred to as a direction of depth. The widthwise direction and the direction of depth are orthogonal to each other. Furthermore, directions of the drawings in FIGS. 2, 3A, and 4-9 are similarly based on the orientation of the image forming apparatus 1 as defined above and correspond to those with respect to the image forming apparatus 1 shown in FIG. 1 even when the drawings are viewed from different angles. Meanwhile, the arrows in the accompanying drawings are appended merely to illustrate relative positions of the elements in the image forming apparatus 1, and arrangement of the elements in the electric device may not necessarily limited to that shown in the accompanying drawings.

In the following description, a quantity of each component denoted by a reference sign may be, unless otherwise noted, at least one.

First Embodiment

1. Overall Configuration of an Operation Panel in the Image Forming Apparatus 1

FIG. 1 is an illustrative external perspective view of the image forming apparatus 1 according to the first embodiment of the present invention. The image forming apparatus 1 includes a chassis 3, which has an overall shape of a six-sided rectangular box. The chassis 3 accommodates an image forming unit (not shown) to form an image on a sheet. On the front side of the chassis 3, disposed is an operation panel 5.

The operation panel 5 is attached to a frontward face of the chassis 3 by a pair of hinges 5A, 5B, which are arranged on an upper end of the operation panel 5, so that a panel face 5C of the operation panel 5 is movable to swing with respect to the chassis 3.

More specifically, the operation panel 5 is movable to swing between a position, in which the panel face 5 substantially aligns with a horizontal plane, and a position, in which the panel face 5 substantially aligns with a vertical plane, and may be stopped at an intermediate position between the horizontal and vertical positions. Thus, the user may adjust a position of the operation panel 5 at a preferred angle between the horizontal position and vertical position.

Figure 2:
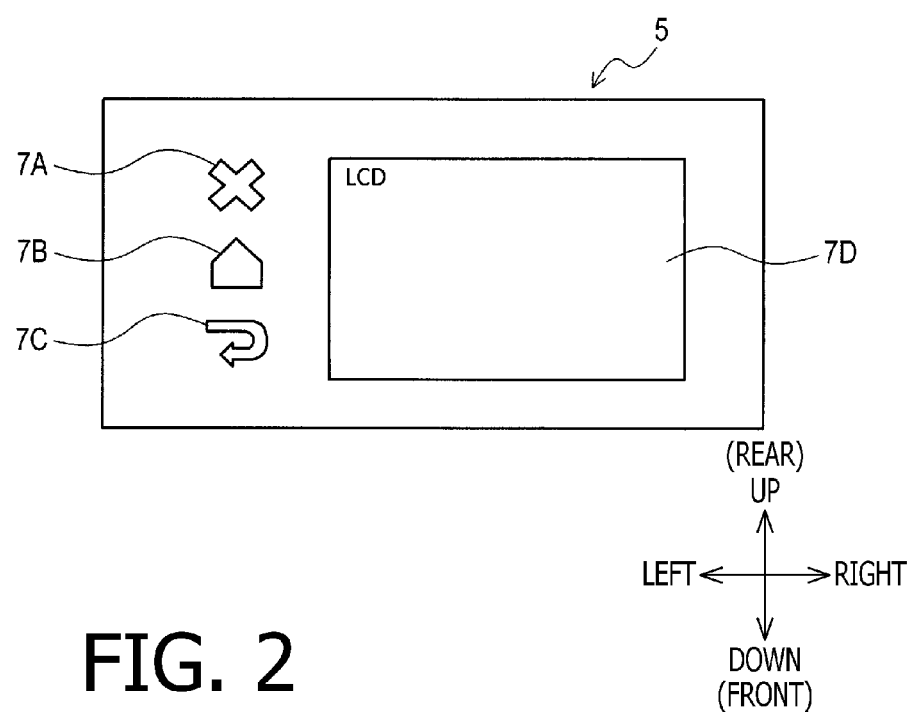
FIG. 2 is an illustrative front view of an operation panel 5 according to the first embodiment of the present invention.

The operation panel 5 includes, as shown in FIG. 2, a plurality of switches 7A-7C, which may be touched by the user to operate the image forming apparatus 1, and a display 7D, which may include, for example, a liquid crystal display (LCD), to display various kinds of information. The switches 7A-7C are capacitance-typed switches, which may detect touches of the user by sensing changes in electrostatic capacity.

In the following description, the switch 7A which is the closest among the switches 7A-7C to the hinges 5A, 5B may be referred to as a first switch 7A, the switch 7B which is farther from the hinges 5A, 5B than the first switch 7A but is closer to the hinges 5A, 5B than the switch 7C may be referred to as a second switch 7B, and the switch 7C which is the farthest among the switches 7A-7C from the hinges 5A, 5B may be referred to as a third switch 7C.

It may be noted that, when the panel face 5C is at an inclined position with respect to the horizontal plane (see FIG. 3A), and when the panel face 5C aligns with the horizontal plane (not shown), the second switch 7B is at a frontward position with respect to the first switch 7A, and the third switch 7C is at a frontward position with respect to the second switch 7B.

Meanwhile, when the panel face 5C is at an inclined position with respect to the horizontal plane (see FIG. 3A), and when the panel face 5C aligns with the vertical plane (not shown), the second switch 7B is at a lower position than the first switch 7A, and the third switch 7C is at a lower position than the second switch 7B.

The switches 7A-7C are configured to have different levels of sensitivities from one another: the first switch 7A is more sensitive than the second switch 7B, and the second switch 7B is more sensitive than the third switch 7C. In other words, the second switch 7B has lower sensitivity than the first switch 7A, and the third switch has lower sensitivity than the second switch 7B.

The sensitivities of the switches 7A-7C refers to degrees of easiness to detect touches of the user to the switches 7A-7C. Therefore, the less sensitive the switches 7A-7C are, the more difficult it is for the switches 7A-7C to detect the touches of the user. The more sensitive the switches 7A-7C are, the easier it is for the switches 7A-7C to detect the touches of the user.

2. Overall Description of the Switches

Figure 3A:
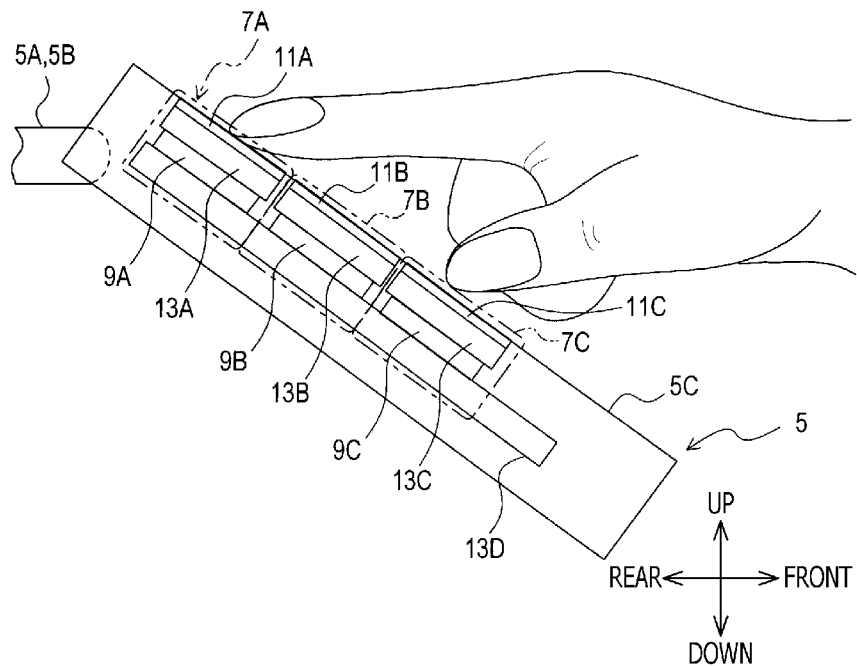
FIG. 3A is an illustrative cross-sectional view of touch-sensitive switches in the operation panel 5 according to the first embodiment of the present invention.

As shown in FIG. 3A, the first switch 7A includes a first electrode 9A and a first top plate 11A. The first top plate 11A is arranged to cover the first electrode 9A at a position separated from the first electrode 9A.

The second switch 7B includes a second electrode 9B and a second top plate 11B. The second top plate 11B is arranged to cover the second electrode 9B at a position separated from the second electrode 9B.

The third switch 7C includes a third electrode 9C and a third top plate 11C. The third top plate 11C is arranged to cover the third electrode 9C at a position separated from the third electrode 9C.

The switches 7A, 7B, 7C include light-guiding members 13A, 13B, 13C, which guide light to the first, second, third top plates 11A, 11B, 11C respectively, so that visibility of the switches 7A, 7B, 7C may be improved. In this regard, the first, second, third electrodes 9A, 9B, 9C are mounted on a substrate 13D.

Figure 3B:
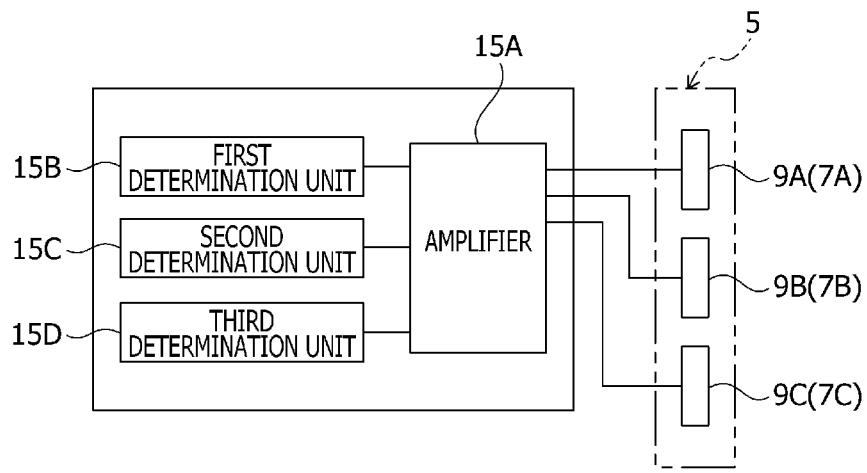
FIG. 3B is a block diagram to illustrate a controlling system to control the touch-sensitive switches in the operation panel 5 according to the first embodiment of the present invention.

Signals output from the electrodes the first, second, third electrodes 9A, 9B, 9C are input to an amplifier 15A (see FIG. 3B), which amplifies the signals at different amplification factors. In particular, the signals output from the second electrode 9B is amplified by the amplifier 15A to be smaller than the signals output from the first electrode 9A, and the signals output from the third electrode 9C is amplified by the amplifier 15A to be smaller than the signals output from the second electrode 9B. In the following description, the signals output from the first, second, and third electrodes 9A, 9B, and 9C may be referred to as first output signals, second output signals, and third output signals, respectively.

Thus, the amplifier 15A amplifies the first output signals at a greater amplification factor than the second output signals and the second output signals at a greater amplification factor than the third output signals. The amplified first, second, and third output signals are input in a first determination unit 15B, a second determination unit 15C, and a third determination unit 15D, respectively.

The first determination unit 15B determines, when the first output signals having been input thereto indicate a value greater than or equal to a first threshold C1, that the first switch 7A is actuated, i.e., the user touched the first switch 7A. The first determination unit 15B determines, when the first output signals having been input thereto indicate a value smaller than the first threshold C1, that the first switch 7A is not actuated.

Similarly, the second determination unit 15C determines, when the second output signals having been input thereto indicate a value greater than or equal to a second threshold C2, that the second switch 7B is actuated. The second determination unit 15C determines, when the second output signals having been input thereto indicate a value smaller than the second threshold C2, that the second switch 7B is not actuated.

The third determination unit 15D determines, when the third output signals having been input thereto indicate a value greater than or equal to a third threshold C3, that the third switch 7C is actuated. The third determination unit 15D determines, when the third output signals having been input thereto indicate a value smaller than the second threshold C3, that the third switch 7C is not actuated.

The first, second, and third thresholds C1, C2, C3 are predetermined values, which may be stored in non-volatile memory units (not shown) in read-only memories (ROMs) in the first, second, and third determination units 15B, 15C, 15D respectively.

According to the present embodiment, the first, second, and third thresholds C1, C2, C3 are equal; therefore, the sensitivities of the first, second, and third switches 7A, 7B, 7C correspond to the amplification factors for the first, second, and third output signals. In other words, the first switch 7A is more sensitive than the second switch 7B, and the second switch is more sensitive than the third switch 7C.

3. Features of the Electric Device in the Image Forming Apparatus

As shown in FIG. 3A, when the angle between the user's finger and the operation panel 5 is rather small, a switch, which is closer to the user (e.g., the third switch 7C), may be touched by the user earlier than a switch, to which the user's finger is directed (e.g., the first switch 7A). In other words, the user may touch the closer switch more easily. Thus, an unintended switch may be erroneously actuated against the user's intention.

According to the present embodiment, however, the sensitivity of the third switch 7C, which is in the position closer to the user, is lower than the sensitivity of the first switch 7A, toward which the user's finger is directed. Therefore, even if the user touches the closer third switch 7C, the third switch 7C may not be actuated, and the erroneous actuation of the closer switch against the user's intention may be restrained.

Second Embodiment

In the first embodiment described above, while the amplification factor for the first output signals is greater than the amplification factor for the second output signals, and the amplification factor for the second output signals is greater than the amplification factor for the third output signals, the first threshold C1, the second threshold C2, and the third threshold C3 are equal so that the first switch 7A is more sensitive than the second switch 7B, and the second switch 7B is more sensitive than the third switch 7C.

In the second embodiment, meanwhile, at least the first threshold C1 is set to be smaller than the second threshold C2, and the second threshold C2 is set to be smaller than the third threshold C3 so that the first switch 7A is more sensitive than the second switch 7B, and the second switch 7B is more sensitive than the third switch 7C.

Thereby, the sensitivity of the third switch 7C, which may be closer to the user, is lowered than the sensitivity of the first switch 7A, at which the user's finger may be directed. Accordingly, the erroneous actuation of the closer switch against the user's intention may be restrained.

In the second embodiment, while the first, second, third thresholds C1, C2, C3 are varied, the amplification factors for the first, second, and third output signals are equal. However, the amplification factors may not necessarily be equal as long as the sensitivities of the first, second, third switches 7A, 7B, 7C are varied as above.

Third Embodiment

According to the first and second embodiments, the switches 7A, 7B, 7C are touch-sensitive switches, which are identically configured to be equally sensitive. However, the sensitivities of the switches 7A, 7B, 7C may not be equalized but may be varied.

Figure 4:
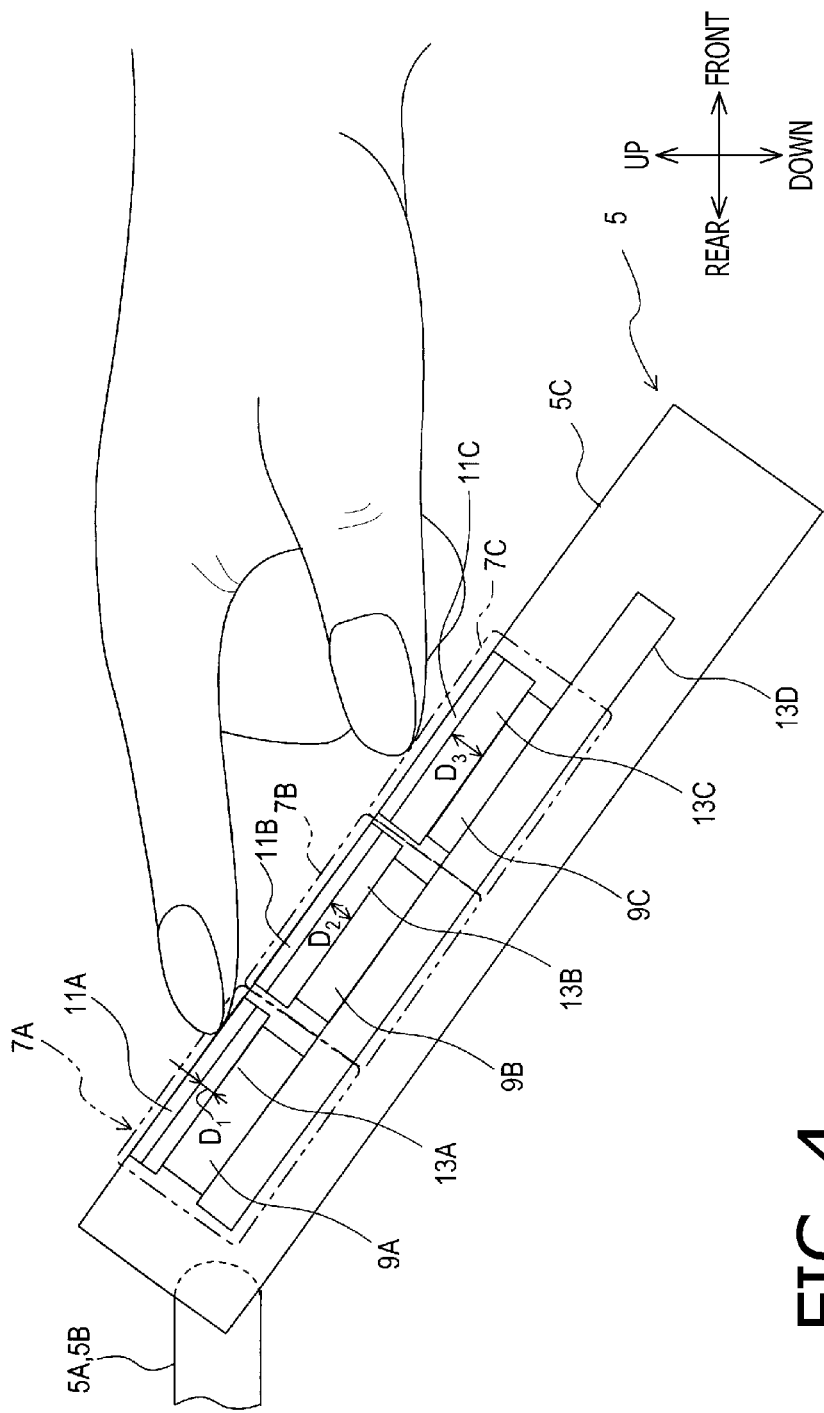
FIG. 4 is an illustrative cross-sectional view of touch-sensitive switches in the operation panel 5 according to a third embodiment of the present invention.

For example, as shown in FIG. 4, a distance D2 between the second electrode 9B and the second top plate 11B may be longer than a distance D1, which is between the first electrode 9A and the first top plate 11A. A distance D3 between the third electrode 9C and the third top plate 11C may be longer than the distance D2 between the second electrode 9B and the second top plate 11B.

Thus, while the distance D1 is shorter than the distance D2, and the distance D2 is shorter than the distance D3, the sensitivities of the switches 7A-7B may be differed so that the first switch 7A is more sensitive than the second switch 7B, and the second switch 7B is more sensitive than the third switch 7C.

Thereby, the sensitivity of the third switch 7C, which may be closer to the user, is lowered than the sensitivity of the first switch 7A, at which the user's finger may be directed. Accordingly, the erroneous actuation of the closer switch against the user's intention may be restrained.

In the third embodiment, the amplification factors for the first, second, and third output signals are equal, and the first, second, and third thresholds C1, C2, and C3 are also equal. However, the amplification factors and/or the thresholds C1, C2, C3 may not necessarily be equal as long as the sensitivities of the first, second, third switches 7A, 7B, 7C are differed as above.

Fourth Embodiment

According to the fourth embodiment, the switches 7A, 7B, 7C are touch-sensitive switches configured to have different sensitivities.

Figure 5:
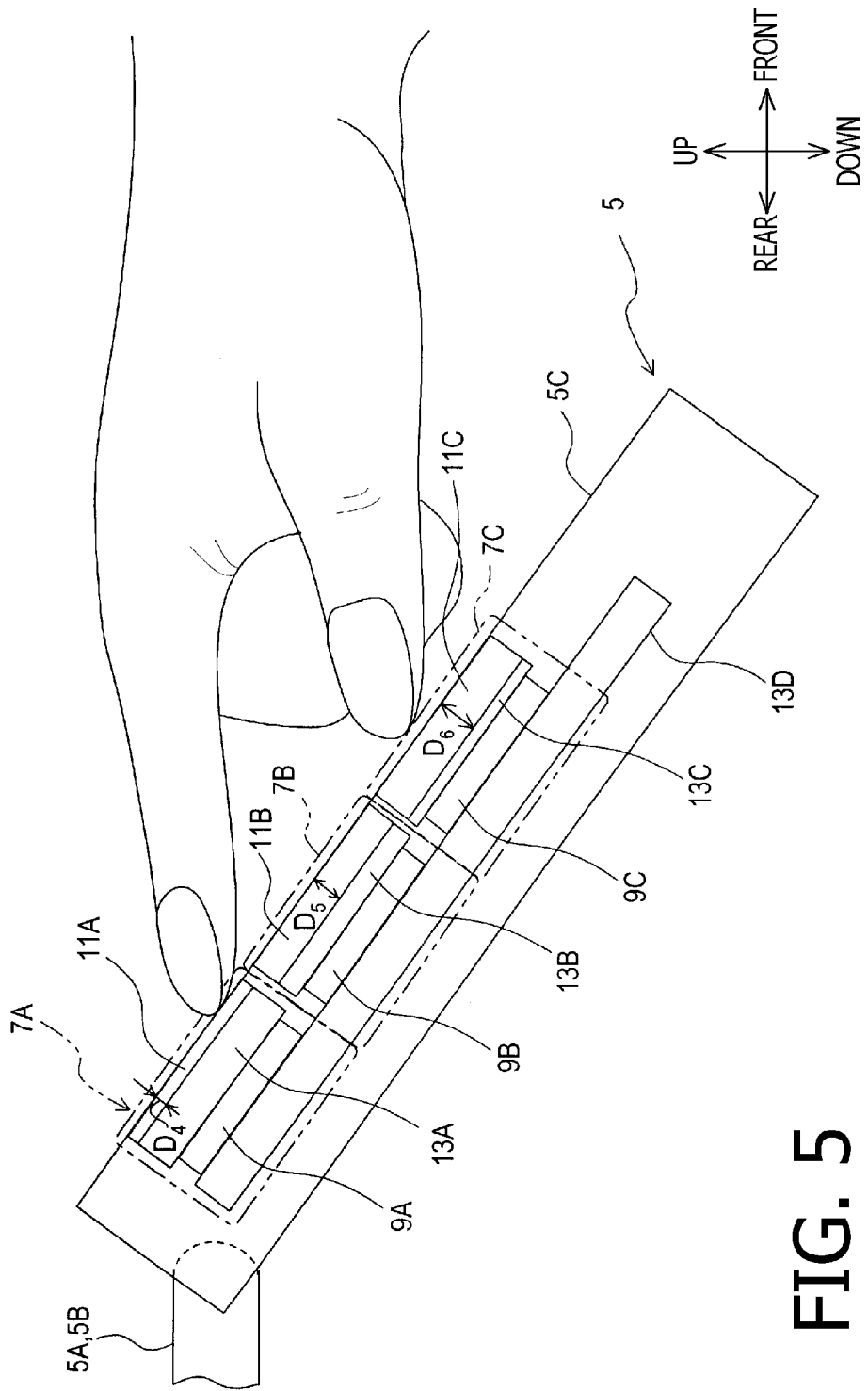
FIG. 5 is an illustrative cross-sectional view of touch-sensitive switches in the operation panel 5 according to a fourth embodiment of the present invention.

As shown in FIG. 5, a thickness D5 of the second top plate 11B may be greater than a thickness D4 of the first top plate 11A, and a thickness D6 of the third top plate 11C may be greater than the thickness D5 of the second top plate 11B.

Thus, while the distance D4 is smaller than the distance D5, and the distance D5 is smaller than the distance D6, the sensitivities of the switches 7A, 7B, 7C may be differed so that the first switch 7A is more sensitive than the second switch 7B, and the second switch 7B is more sensitive than the third switch 7C.

Thereby, the sensitivity of the third switch 7C, which may be closer to the user, is lowered than the sensitivity of the first switch 7A, at which the user's finger may be directed. Accordingly, the erroneous actuation of the closer switch against the user's intention may be restrained.

In the fourth embodiment, the amplification factors for the first, second, and third output signals are equal, and the first, second, third thresholds C1, C2, C3 are also equal. However, the amplification factors and/or the thresholds C1, C2, C3 may not necessarily be equal as long as the sensitivities of the first, second, third switches 7A, 7B, 7C are varied as above.

Fifth Embodiment

According to the fifth embodiment, the switches 7A, 7B, 7C are touch-sensitive switches configured to have different sensitivities.

For example, a permittivity $\epsilon 2$ of the second top plate 11B may be smaller than a permittivity $\epsilon 1$ of the first top plate 11A, and a permittivity $\epsilon 3$ of the third top plate 11C may be smaller than the permittivity $\epsilon 2$ of the second top plate 11B.

Thus, while the permittivity $\epsilon 1$ of the first top plate 11A may be greater than the permittivity $\epsilon 2$ of the second top plate 11B, and the permittivity ∈2 of the second top plate 11B may be greater than the permittivity ∈3 of the third top plate 11C, the sensitivities of the switches 7A, 7B, 7C may be differed so that the first switch 7A is more sensitive than the second switch 7B, and the second switch 7B is more sensitive than the third switch 7C.

Thereby, the sensitivity of the third switch 7C, which may be closer to the user, is lowered than the sensitivity of the first switch 7A, at which the user's finger may be directed. Accordingly, the erroneous actuation of the closer switch against the user's intention may be restrained.

In the fifth embodiment, the amplification factors for the first, second, and third output signals are equal, and the first, second, and third thresholds C1, C2, and C3 are also equal. Further, the distances D1, D2, and D3 are equal, and the thicknesses D4, D5, and D6 are equal. However, the amplification factors, the thresholds C1, C2, C3, the distances D1, D2, D3, and/or the thicknesses D4, D5, D6 may not necessarily be equal as long as the sensitivities of the first, second, and third switches 7A, 7B, and 7C are varied as above.

Sixth Embodiment

Figure 6:
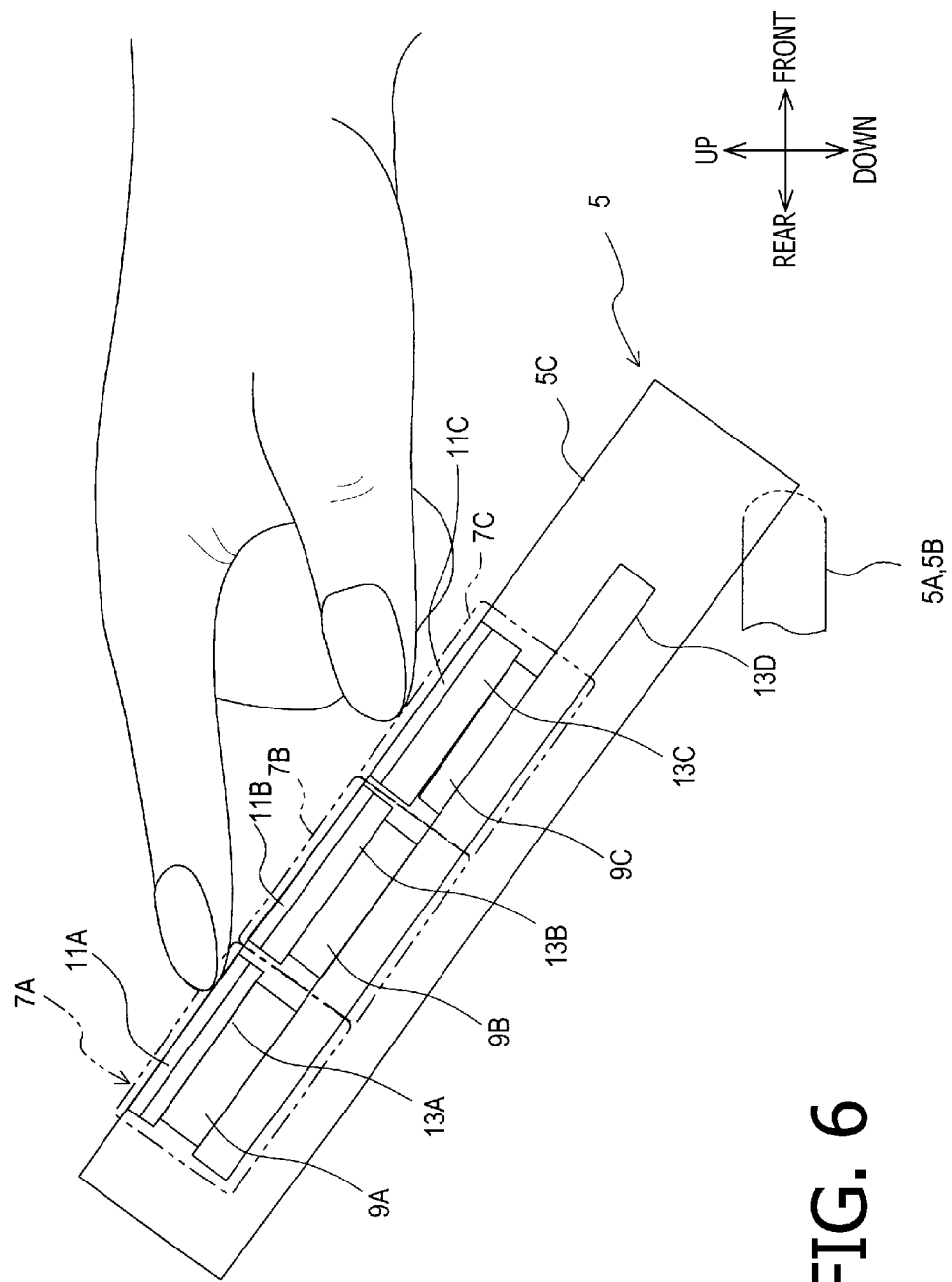
FIG. 6 is an illustrative cross-sectional view of touch-sensitive switches in the operation panel 5 according to a sixth embodiment of the present invention.

According to the sixth embodiment, as shown in FIG. 6, the pair of hinges 5A, 5B is arranged on a lower end of the operation panel 5 rather than the upper end of the operation panel 5. With respect to the hinges 5A, 5B, the first switch 7A is at a farthest position among the switches 7A, 7B, 7C, the second switch 7B is at a closer position than the first switch 7A, and the third switch 7C is at a closest position among the switches 7A, 7B, 7C.

With this arrangement, the sensitivities of the switches 7A, 7B, 7C may be varied from one another: the first switch 7A may be more sensitive than the second switch 7B, and the second switch 7B may be more sensitive than the third switch 7C. In other words, the closer to hinges 5A, 5B the switches 7A, 7B, 7C are located, the less sensitive the switches 7A, 7B, 7C are.

FIG. 6 is an example applied to the electric device (see FIG. 3A) described in, for example, but not limited to, the first embodiment. The sixth embodiment may be applied to the electric devices described in the second, third, fourth, and fifth embodiment as well. The sixth embodiment may be applied to the electric device when, for example, but not limited to, the operation panel 5 is disposed on an upward face of the chassis 3.

Seventh Embodiment

Figure 7:
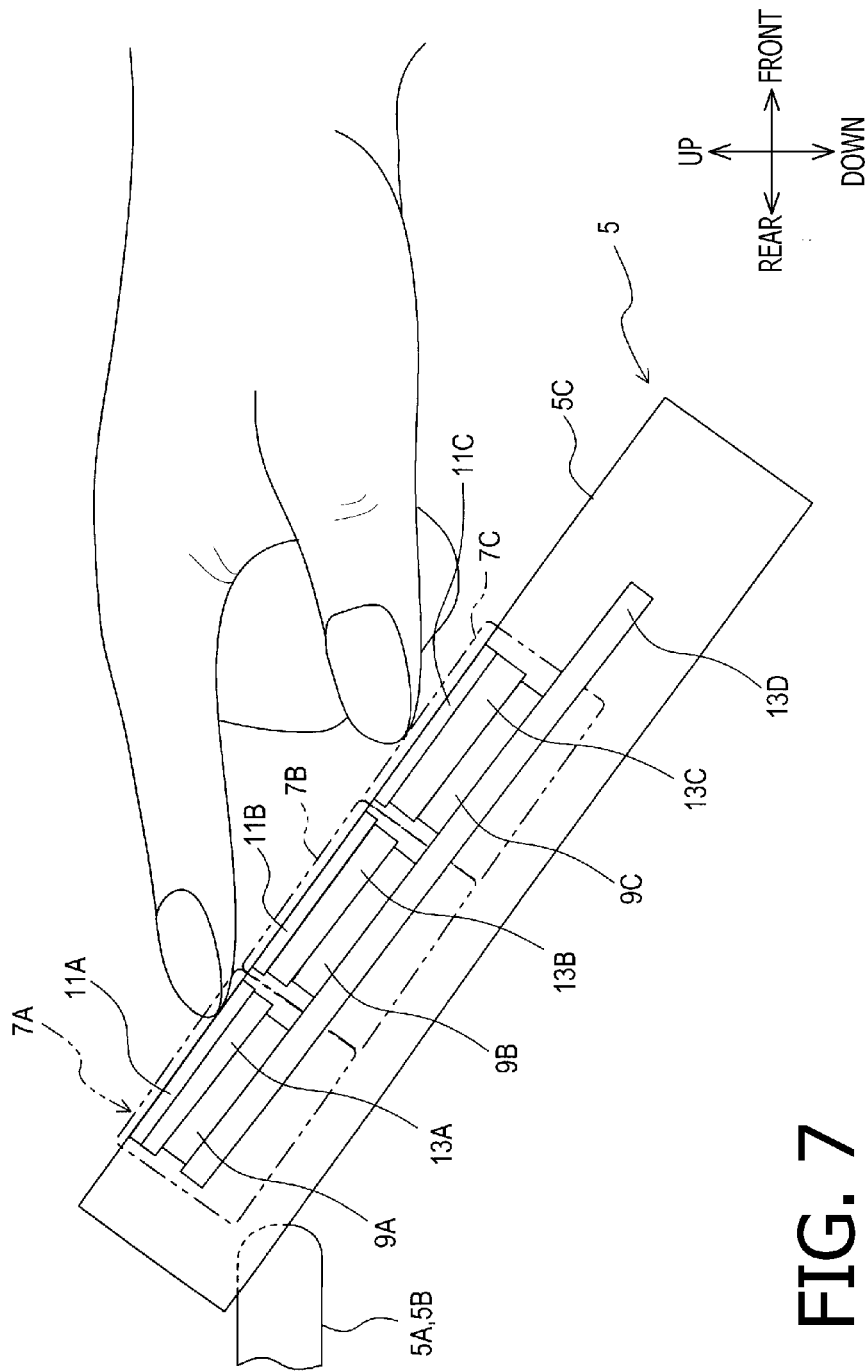
FIG. 7 is an illustrative cross-sectional view of touch-sensitive switches in the operation panel 5 according to a seventh embodiment of the present invention.

According to the seventh embodiment, as shown in FIG. 7, the substrate 13D is in an arrangement such that a plane of the substrate 13D facing the panel face 5C inclines with respect to the panel face 5C; the thicknesses of the first, second, third electrodes 9A, 9B, 9C are equal to one another; and the thicknesses of the first, second, third top plates 11A, 11B, 11C are equal to one another.

Meanwhile, the light guides 13A, 13B, 13C each are formed to have a cross-sectional shape of a wedge, or a trapezoid, which may compensate the angle differences between the first, second, third electrodes 9A, 9B, 9C and the first, second, third top plates 11A, 11B, 11C. For example, the light guides 13A, 13B, 13C may be formed to be thinner at the ends closer to the hinges 5A, 5B and thicker at the other ends farther from the hinges 5A, 5B.

With this arrangement, the sensitivities of the switches 7A, 7B, 7C may be varied from one another: the first switch 7A may be more sensitive than the second switch 7B, and the second switch 7B may be more sensitive than the third switch 7C.

Eighth Embodiment

Figure 8:
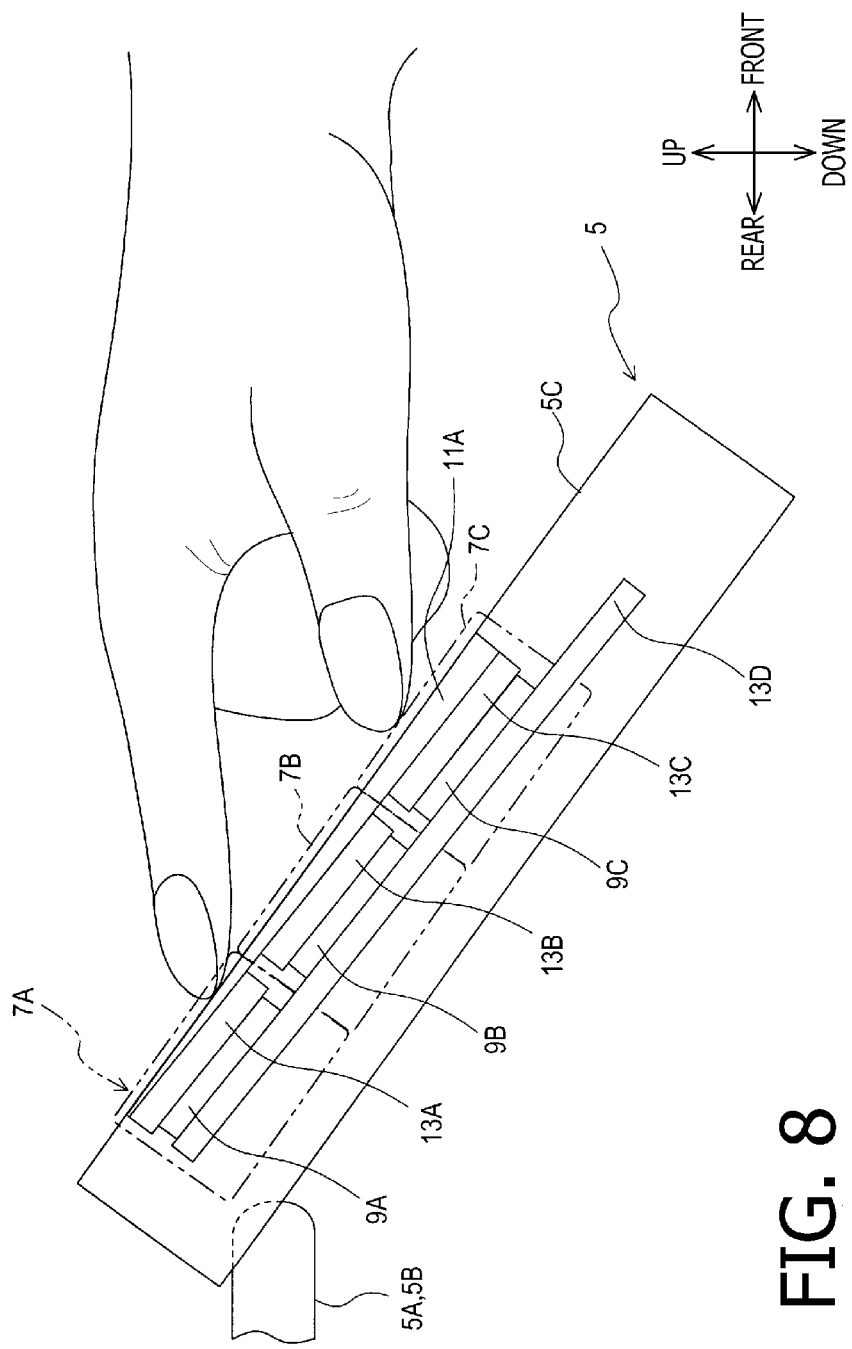
FIG. 8 is an illustrative cross-sectional view of touch-sensitive switches in the operation panel 5 according to an eighth embodiment of the present invention.

According to the eighth embodiment, as shown in FIG. 8, the first, second, and third top plates 11A, 11B, 11C may be replaced with a single top plate 11A. The single top plate 11A may be in an arrangement such that a plane closer to the light guides 13A, 13B, 13C inclines with respect to the panel face 5C.

Thereby, the top plate 11A may have a cross-sectional shape of a wedge, or a trapezoid, which is thinner at the side closer to hinges 5A, 5B and thicker at the side farther from the hinges 5A, 5B. Meanwhile, thicknesses of the light guides 13A, 13B, 13C are equal to one another; the thicknesses of the first, second, third electrodes 9A, 9B, 9C are equal to one another; and the thickness of the substrate 13D is constant. Therefore, the light guides 13A, 13B, 13C; the first, second, third electrodes 9A, 9B, 9C; and the substrate 13D spread in parallel with one another.

With this arrangement, the sensitivities of the switches 7A, 7B, 7C may be varied from one another: the first switch 7A may be more sensitive than the second switch 7B, and the second switch 7B may be more sensitive than the third switch 7C.

Ninth Embodiment

Figure 9:
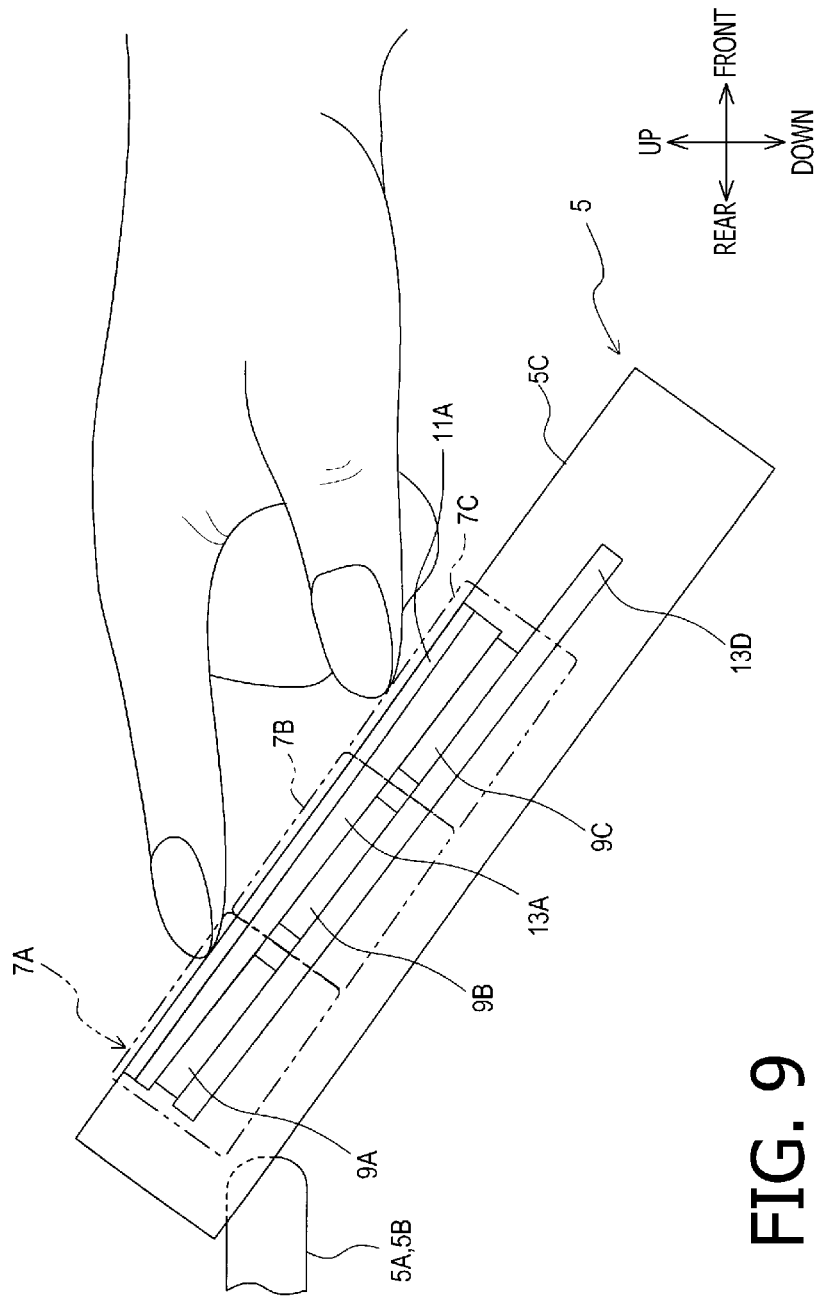
FIG. 9 is an illustrative cross-sectional view of touch-sensitive switches in the operation panel 5 according to a ninth embodiment of the present invention.

According to the ninth embodiment, as shown in FIG. 9, the first, second, and third top plates 11A, 11B, 11C may be replaced with a single top plate 11A; and the light guides 13A, 13B, 13C may be replaced with a single piece of light guide 13A. The single piece of light guide 13A may be in an arrangement such that a plane closer to the first, second, and third electrodes 9A, 9B, 9C inclines with respect to the panel face 5C.

Thereby, the light guide 13A may have a cross-sectional shape of a wedge, or a trapezoid, which is thinner at the side closer to hinges 5A, 5B and thicker at the side farther from the hinges 5A, 5B. Meanwhile, thickness of the top plate 11A may be constant; the thicknesses of the first, second, third electrodes 9A, 9B, 9C may be equal to one another, and the thickness of the substrate 13D may be constant. The top plate 11A; the first, second, third electrodes 9A, 9B, 9C; and the substrate 13D may spread in parallel with one another.

With this arrangement, the sensitivities of the switches 7A, 7B, 7C may be varied from one another: the first switch 7A may be more sensitive than the second switch 7B, and the second switch 7B may be more sensitive than the third switch 7C.

Although examples of carrying out the invention has been described, those skilled in the art will appreciate that there are numerous variations and permutations of the electric device that fall within the spirit and scope of the invention as set forth in the appended claims. It is to be understood that the subject matter defined in the appended claims is not necessarily limited to the specific features or act described above. Rather, the specific features and acts described above are disclosed as example forms of implementing the claims. In the meantime, the terms used to represent the components in the above embodiment may not necessarily agree identically with the terms recited in the appended claims, but the terms used in the above embodiment may merely be regarded as examples of the claimed subject matters.

For example, the operation panel 5 may not necessarily be swingably attached to the chassis 3 by the pair of hinges 5A, 5B, but the hinges 5A, 5B may be omitted while the angle of the operation panel 5, or the panel face 5C, may be invariable. When the operation panel 5, or the panel face 5C, is immovable with respect to the chassis 3, the panel face 5C may be placed to be at a horizontal, vertical or inclined angle with respect to the horizontal plane. For another example, the operation panel 5 may not necessarily be disposed on the frontward face of the chassis 3 but may be disposed on, for example, an upward, a rearward, or a sideward face of the chassis 3.

For another example, the quantity of the touch-sensitive switches 7A, 7B, 7C to be provided to the operation panel 5 may not necessarily be three but may be two or more than three.

For another example, the present disclosure may not necessarily be applied to the image forming apparatus 1 as described above but may be applied to another electric devices such as an image reading apparatus and a facsimile machine.

What is claimed is:

1. An electric device, comprising:
   a chassis comprising an operation panel to be manipulated by a user, the operation panel being disposed on a face of the chassis, the operation panel comprising a frontward end and a rearward end; and
   a first switch and a second switch arranged on the operation panel, the first switch and the second switch being configured to be actuated by a change in capacitance;
   wherein the second switch is arranged in a position closer to the frontward end of the operation panel than the first switch and configured to be less sensitive than the first switch; and
   wherein a sensitivity of the first switch and a sensitivity of the second switch are set based on relative positions of the first switch and the second switch on the operation panel between the frontward end and the rearward end.

2. The electric device according to claim 1,
   wherein the operation panel is attached to the chassis by a hinge;
   wherein the hinge is arranged on the rearward end of the operation panel in a position closer to the first switch and father from the second switch; and
   wherein the operation panel is swingable about the rearward end thereof.

3. The electric device according to claim 1,
   wherein the operation panel is attached to the chassis by a hinge;
   wherein the hinge is arranged on the frontward end of the operation panel in a position farther from the first switch and closer to the second switch; and
   wherein the operation panel is swingable about the frontward end thereof.

4. The electric device according to claim 1, further comprising:
   an amplifier configured to amplify outputs from the first switch and the second switch,
   wherein the output from the second switch is amplified to be smaller than the output from the first switch being amplified.

5. The electric device according to claim 1, further comprising:
   a first determination unit configured to determine that the first switch is actuated when output from the first switch is one of greater than and equal to a predetermined first threshold; and
   a second determination unit configured to determine that the second switch is actuated when output from the second switch is one of greater than and equal to a predetermined second threshold, the predetermined second threshold being greater than the predetermined first threshold.

6. The electric device according to claim 1,
   wherein the first switch comprises a first electrode and a first top plate, the first top plate being arranged to cover the first electrode at a position separated from the first electrode;
   wherein the second switch comprises a second electrode and a second top plate, the second top plate being arranged to cover the second electrode at a position separated from the second electrode; and
   wherein a distance between the second electrode and the second top plate is greater than a distance between the first electrode and the first top plate.

7. The electric device according to claim 1,
   wherein the first switch comprises a first electrode and a first top plate, the first top plate being arranged to cover the first electrode at a position separated from the first electrode;
   wherein the second switch comprises a second electrode and a second top plate, the second top plate being arranged to cover the second electrode at a position separated from the second electrode; and
   wherein a of thickness of the second top plate is greater than a of thickness of the first top plate.

8. The electric device according to claim 1,
   wherein the first switch comprises a first electrode and a first top plate, the first top plate being arranged to cover the first electrode;
   wherein the second switch comprises a second electrode and a second top plate, the second top plate being arranged to cover the second electrode; and
   wherein a permittivity of the second top plate is smaller than a permittivity of the first top plate.

9. The electric device according to claim 1, further comprising:
   a third switch arranged on the operation panel, the third switch being configured to be actuated by a change in capacitance;
   wherein the third switch is arranged in a position closer to the frontward end of the operation panel than the second switch; and
   wherein the third switch is configured to be less sensitive than the second switch.

10. An electric device, comprising:
    a chassis comprising an operation panel to be manipulated by a user, the operation panel being disposed on a face of the chassis, the operation panel comprising an upper end and a lower end; and
    a first switch and a second switch arranged on the operation panel, the first switch and the second switch being configured to be actuated by a change in capacitance;
    wherein the second switch is arranged in a position closer to the lower end of the operation panel than the first switch and configured to be less sensitive than the first switch; and
    wherein a sensitivity of the first switch and a sensitivity of the second switch are set based on relative positions of the first switch and the second switch on the operation panel between the upper end and the lower end.

11. The electric device according to claim 10,
    wherein the operation panel is attached to the chassis by a hinge;
    wherein the hinge is arranged on the upper end of the operation panel in a position closer to the first switch and father from the second switch; and
    wherein the operation panel is swingable about the upper end thereof.

12. The electric device according to claim 10,
wherein the operation panel is attached to the chassis by a hinge;
wherein the hinge is arranged on the lower end of the operation panel in a position farther from the first switch and closer to the second switch; and
wherein the operation panel is swingable about the lower end thereof.

13. The electric device according to claim 10, further comprising:
an amplifier configured to amplify outputs from the first switch and the second switch,
wherein the output from the second switch is amplified to be smaller than the output from the first switch being amplified.

14. The electric device according to claim 10, further comprising:
a first determination unit configured to determine that the first switch is actuated when output from the first switch is one of greater than and equal to a predetermined first threshold; and
a second determination unit configured to determine that the second switch is actuated when output from the second switch is one of greater than and equal to a predetermined second threshold, the predetermined second threshold being greater than the predetermined first threshold.

15. The electric device according to claim 10,
wherein the first switch comprises a first electrode and a first top plate, the first top plate being arranged to cover the first electrode at a position separated from the first electrode;
wherein the second switch comprises a second electrode and a second top plate, the second top plate being arranged to cover the second electrode at a position separated from the second electrode; and
wherein a distance between the second electrode and the second top plate is greater than a distance between the first electrode and the first top plate.

16. The electric device according to claim 10,
wherein the first switch comprises a first electrode and a first top plate, the first top plate being arranged to cover the first electrode at a position separated from the first electrode;
wherein the second switch comprises a second electrode and a second top plate, the second top plate being arranged to cover the second electrode at a position separated from the second electrode; and
wherein a of thickness of the second top plate is greater than a of thickness of the first top plate.

17. The electric device according to claim 10,
wherein the first switch comprises a first electrode and a first top plate, the first top plate being arranged to cover the first electrode;
wherein the second switch comprises a second electrode and a second top plate, the second top plate being arranged to cover the second electrode; and
wherein a permittivity of the second top plate is smaller than a permittivity of the first top plate.

18. The electric device according to claim 10, further comprising:
a third switch arranged on the operation panel, the third switch being configured to be actuated by a change in capacitance;
wherein the third switch is arranged in a position closer to the lower end of the operation panel than the second switch; and
wherein the third switch is configured to be less sensitive than the second switch.

19. An electric device, comprising:
a chassis; and
an operation panel being disposed on a face of the chassis, the operation panel comprising one end and an other end opposite from the one end, and the operation panel including:
a first capacitive touch switch configured to be responsive to a touch, the first capacitive touch switch having a first sensitivity for responding to the touch; and
a second capacitive touch switch configured to be responsive to a touch, the second capacitive touch switch having a second sensitivity for responding to the touch,
wherein the second capacitive touch switch is arranged in a position closer to the one end of the operation panel than the first capacitive touch switch, and the second sensitivity of the second capacitive touch switch is lower than the first sensitivity of the first capacitive touch switch; and
wherein a sensitivity of the first capacitive touch switch and a sensitivity of the second capacitive touch switch are set based on relative positions of the first capacitive touch switch and the second capacitive touch switch on the operation panel between the one end and the other end.

20. The electric device according to claim 19,
wherein the one end of the operation panel is a frontward end of the operation panel, and the other end of the operation panel is a rearward end of the operation panel; and
wherein the second capacitive touch switch is arranged in a position closer to the frontward end of the operation panel than the first capacitive touch switch.

21. The electric device according to claim 20, further comprising a hinge,
wherein the rearward end of the operation panel is attached to the chassis by the hinge; and
wherein the operation panel is swingable about the hinge.

22. The electric device according to claim 20, further comprising a hinge,
wherein the frontward end of the operation panel is attached to the chassis by the hinge; and
wherein the operation panel is swingable about the hinge.

23. The electric device according to claim 19,
wherein the one end of the operation panel is an upper end of the operation panel, and the other end of the operation panel is a lower end of the operation panel;
wherein the second capacitive touch switch is arranged in a position closer to the lower end of the operation panel than the first capacitive touch switch.

24. The electric device according to claim 23, further comprising a hinge,
wherein the upper end of the operation panel is attached to the chassis by the hinge; and
wherein the operation panel is swingable about the hinge.

25. The electric device according to claim 23, further comprising a hinge,
wherein the lower end of the operation panel is attached to the chassis by the hinge; and
wherein the operation panel is swingable about the hinge.

26. The electric device according to claim 19,
wherein the first capacitive touch switch comprises a first electrode and a first top plate, the first top plate being arranged to cover the first electrode at a position separated from the first electrode;

wherein the second capacitive touch switch comprises a second electrode and a second top plate, the second top plate being arranged to cover the second electrode at a position separated from the second electrode; and wherein a distance between the second electrode and the second top plate is greater than a distance between the first electrode and the first top plate.

27. The electric device according to claim 19, wherein the first capacitive touch switch comprises a first electrode and a first top plate, the first top plate being arranged to cover the first electrode at a position separated from the first electrode;

wherein the second capacitive touch switch comprises a second electrode and a second top plate, the second top plate being arranged to cover the second electrode at a position separated from the second electrode; and wherein a thickness of the second top plate is greater than a thickness of the first top plate.

28. The electric device according to claim 19, further comprising:

a third capacitive touch switch arranged on the operation panel, the third capacitive touch switch being configured to be actuated by a change in capacitance;

wherein the third capacitive touch switch is arranged in a position closer to the one end of the operation panel than the second capacitive touch switch; and wherein the third capacitive touch switch is configured to be less sensitive than the second capacitive touch switch.

* * * * *